(12) United States Patent
Gallerano et al.

(10) Patent No.: US 7,511,932 B1
(45) Date of Patent: Mar. 31, 2009

(54) ESD PROTECTION STRUCTURE

(75) Inventors: Antonio Gallerano, Redwood City, CA (US); Jeffrey T. Watt, Palo Alto, CA (US); Srinivas Perisetty, Santa Clara, CA (US); Cheng-Hsiung Huang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 36 days.

(21) Appl. No.: 11/836,700

(22) Filed: Aug. 9, 2007

Related U.S. Application Data

(60) Continuation-in-part of application No. 11/339,907, filed on Jan. 25, 2006, which is a continuation-in-part of application No. 10/882,874, filed on Jun. 30, 2004, now Pat. No. 7,195,958, which is a division of application No. 10/298,104, filed on Nov. 14, 2002, now Pat. No. 6,777,721.

(51) Int. Cl.
*H02H 9/00* (2006.01)
*H02H 1/00* (2006.01)

(52) U.S. Cl. .................................................. 361/56
(58) Field of Classification Search .................. 361/56
See application file for complete search history.

(56) References Cited

U.S. PATENT DOCUMENTS

| | | | |
|---|---|---|---|
| 4,829,350 A * | 5/1989 | Miller | 257/357 |
| 6,300,800 B1 * | 10/2001 | Schmitt et al. | 326/86 |
| 6,747,857 B1 * | 6/2004 | Lee et al. | 361/56 |
| 7,042,689 B2 * | 5/2006 | Chen | 361/56 |
| 2003/0058027 A1 * | 3/2003 | Kwon et al. | 327/401 |
| 2004/0142527 A1 * | 7/2004 | Chen | 438/238 |
| 2005/0205928 A1 * | 9/2005 | Kwon et al. | 257/345 |
| 2008/0067588 A1 * | 3/2008 | Williams et al. | 257/343 |

* cited by examiner

*Primary Examiner*—Ronald W Leja
(74) *Attorney, Agent, or Firm*—Ward & Olivo

(57) ABSTRACT

The present invention is an ESD protection circuit that discharges both positive and negative electrostatic events. A preferred embodiment of the circuit comprises a first NMOS transistor having a source and drain connected between ground and an I/O pad and second and third NMOS transistors and a resistor connected in series between ground and the I/O pad. The gate and body of the first transistor and the bodies of the second and third transistors are connected to a node between the second and third transistors; the gate of the second transistor is connected to the I/O pad through a second resistor; and the gate of the third transistor is connected to ground. The second and third transistors maintain the gate and body voltage of the first transistor at the pad voltage when the pad experiences negative voltages and at ground voltage when the pad experiences positive voltages. As a result, the first transistor can discharge both negative and positive ESC events through parasitic bipolar conduction, without any additional circuits such as diodes used either to stop leakage currents or to conduct ESD current.

20 Claims, 2 Drawing Sheets

US 7,511,932 B1

ESD PROTECTION STRUCTURE

CROSS REFERENCE TO RELATED APPLICATIONS

This application is a continuation-in-part of application Ser. No. 11/339,907 filed Jan. 25, 2006 which application is a continuation-in-part of application Ser. No. 10/882,874, filed Jun. 30, 2004, now U.S. Pat. No. 7,195,958 for "Methods of Fabricating ESD Protection Structures," which application is a divisional of application Ser. No. 10/298,104, filed Nov. 14, 2002, now U.S. Pat. No. 6,777,721, for "SCR Device for ESD Protection." The '907 application and the '958 and '721 patents are incorporated herein by reference in their entireties.

FIELD OF THE INVENTION

This relates to electrostatic discharge (ESD) protection structures for protecting an integrated circuit from ESD damage.

BACKGROUND OF THE INVENTION

ESD protection has been a main concern in the reliability of integrated circuit (IC) products in submicron complimentary metal-oxide-silicon (CMOS) technologies. For example, gates in N-type metal metal-oxide-silicon (NMOS) and P-type metal-oxide-silicon (PMOS) transistors in input buffers of a CMOS IC are often directly connected to input pads of the IC, causing the CMOS input buffers to be vulnerable to ESD damage.

Grounded gate NMOS (GGNMOS) transistors and gate coupled NMOS (GCNMOS) transistors are a frequent choice for an ESD protection circuit in such technologies. Such a device operates to provide ESD protection by triggering a parasitic lateral bipolar transistor inherent in the MOS structure where the source and drain regions of the MOS transistor constitute the emitter and collector of the lateral bipolar transistor and the substrate constitutes the base. See, for example, A. Amerasekera and C. Durvery, ESD in Silicon Integrated Circuits, pp. 81-95, 137-148 (2d Ed., Wiley, 2002), which is incorporated herein by reference.

A conventional GGNMOS transistor 110 and I/O pad 180 are shown in FIG. 1. Transistor 110 comprises a source 120, a drain 130 and a gate 140. The source and drain are regions of N-type conductivity formed in a substrate or well of P-type conductivity. The substrate or well, which is sometimes referred to as the body, is represented schematically in FIG. 1 by element 150. As shown in FIG. 1, gate 140, source 120 and body 150 are all connected to ground. Drain 130 is connected to I/O pad 180. As will be appreciated by those skilled in the art, a typical integrated circuit has numerous such I/O pads protected by GGNMOS ESD circuits.

P-type body 150 and N-type source region 120 form a first P-N junction and P-type body 150 and N-type drain region 130 form a second P-N junction. As a result, a parasitic lateral bipolar transistor is present in transistor 110 having a base-emitter junction that is the first P-N junction and a base-collector junction that is the second P-N junction. In FIG. 1 the second P-N junction is schematically represented by diode 160. In the event of a positive voltage ESD event on the input pad, the second P-N junction is driven into breakdown and avalanche and the parasitic transistor is triggered into conduction to discharge the ESD pulse.

The circuit of FIG. 1 is susceptible to poor performance due to leakage currents if I/O pad 180 experiences negative voltages during regular operations that are sufficient to turn on diode 160. For example, negative voltages may be present on test pads used to monitor the output of voltage regulators. To prevent such leakage currents, it is conventional to insert a diode 170 in series between the GGNMOS transistor 110 and the I/O pad 180 as shown in FIG. 2. In this arrangement, even if diode 160 becomes forward biased, diode 170 is reverse biased and there is no leakage path. Diode 170 has the disadvantage that during ESD operation it increases the voltage at the I/O pad by an amount equal to $Vg+R_D I_{ESD}$ where Vg is the voltage drop across diode 160, $R_D$ is the resistance of diode 160 and $I_{ESD}$ is the electrostatic discharge current through diode 160.

Diode 170 also eliminates the discharge path through GGNMOS transistor 110 for any negative electrostatic discharge. This is a major disadvantage since positive and negative electrostatic discharges are possible on every I/O pad. One solution is to connect a series of diodes between the I/O pad and ground with the cathode connected to the I/O pad and the anode to ground. This, however, is not an attractive alternative because it takes up too much area on the semiconductor substrate.

SUMMARY OF THE PRESENT INVENTION

The present invention is an ESD protection circuit that discharges both positive and negative electrostatic events. A preferred embodiment of the circuit comprises a first NMOS transistor having a source and drain connected between ground and an I/O pad and second and third NMOS transistors and a resistor connected in series between ground and the I/O pad. The gate and body of the first transistor are connected to a node between the second and third transistors; the gate of the second transistor is connected to the I/O pad through a second resistor; and the gate of the third transistor is connected to ground. The second and third transistors maintain the gate and body voltage of the first transistor at the pad voltage when the pad experiences negative voltages and at ground when the pad experiences positive voltages. During normal circuit operations, leakage is prevented independently of the voltage polarity experienced at the pad.

In the case of a positive electrostatic event, the second transistor is turned on, thereby grounding the gate and body of the first transistor. As a result, the first transistor functions as a GGNMOS transistor. The P-N junction in the first transistor located between the body and the I/O pad breaks down; and a parasitic bipolar transistor in the first transistor conducts to discharge the electrostatic event. In the case of a negative electrostatic event, the second transistor is off and the third transistor located between the body and the I/O pad turns on, thereby applying the pad voltage in the gate and body of the first transistor. In this case, the P-N junction in the first transistor located between the body and ground breaks down; and a parasitic bipolar transistor in the first transistor conducts to discharge the electrostatic event.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
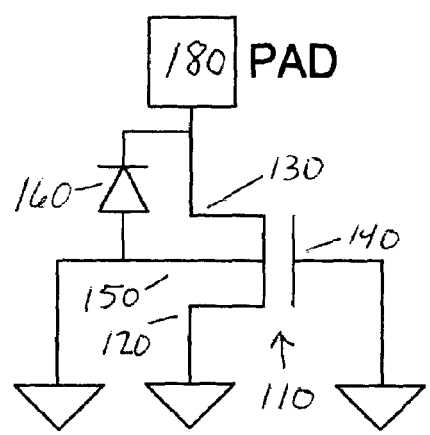
FIGS. 1 and 2 are schematic illustrations of prior art GGNMOS ESD protection circuits.
Figure 2:
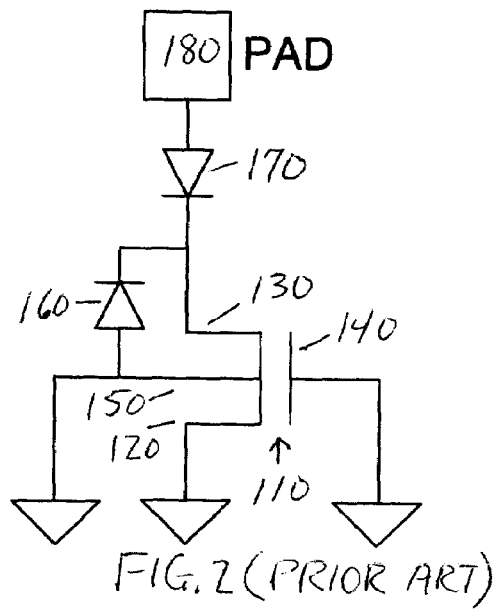
Figure 3:
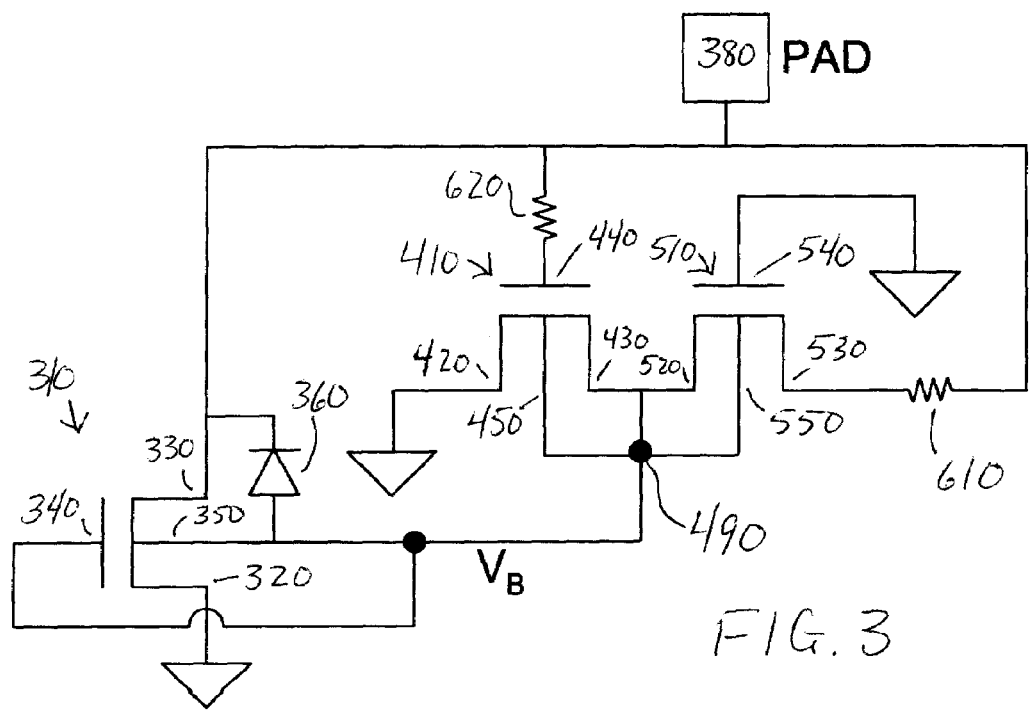
FIG. 3 is a schematic diagram of an illustrative embodiment of the present invention.

FIG. 3 is a schematic illustration of a GCNMOS circuit 300 that provides electrostatic discharge protection for both positive and negative voltages. Circuit 300 comprises a main clamp transistor 310 connected between an I/O pad 380 and ground and first and second auxiliary NMOS transistors 410 and 510 connected in series between the I/O pad and ground. The main clamp transistor comprises a source 320, a drain 330 and a gate 340. The source and drain are regions of N-type conductivity formed in a substrate or well (or body) of P-type conductivity. The substrate or well or body is represented schematically in FIG. 3 by element 350. As shown in FIG. 3, source 320 is connected to ground. Drain 330 is connected to I/O pad 380.

P-type body 350 and N-type source region 320 form a first P-N junction and P-type body 350 and N-type drain region 330 form a second P-N junction. As a result, a parasitic lateral bipolar transistor is present in transistor 310 having a base-emitter junction that is the first P-N junction and a base-collector junction that is the second P-N junction. In FIG. 3 the second P-N junction is schematically represented by diode 360.

The first and second series connected auxiliary transistors 410, 510 each comprise a source 420, 520, a drain 430, 530 and a gate 440, 540, respectively. The source and drain of each transistor 410, 510 are regions of N-type conductivity formed in a substrate or well 450, 550, respectively, of P-type conductivity. Transistors 410, 510 are connected in series to a first resistor 610 which is connected to I/O pad 380. Drain 430 of transistor 410 is connected to source 520 of transistor 510 at a first node 490. Drain 530 of transistor 510 is connected to one end of resistor 610 and the other end of resistor 610 is connected to I/O pad 380. Source 420 of transistor 410 is connected to ground.

As in the case of transistor 310, the P-type body of each of transistors 410 and 510 forms a first P-N junction with the N-type source region 420, 520 of that transistor and a second P-N junction with the N-type drain region 430, 530.

As shown in FIG. 3, gate 440 of transistor 410 is connected by a second resistor 620 to I/O pad 380. The gate of transistor 510 is connected to ground. The gate of transistor 310 and the substrate (or well or body) 350, 450, 550 of each transistor 310, 410, 510 are connected to node 490.

As will be apparent, the circuit of FIG. 3 avoids the use of a diode between the main transistor 310 and I/O pad 380. During an ESD event of either positive or negative polarity, gate 340 and substrate 350 are soft connected to voltage $V_B$, the lowest potential available in the circuit. During regular operation $V_B$ is at the pad voltage when the pad is negative and is grounded when the pad is positive.

The operation of the circuit of FIG. 3 is as follows. During normal operation of the circuit, whatever voltage is on I/O pad 380, transistors 410 and 510 are off. As a result, the voltage on node 490 is low and transistor 310 is off.

In the event of an electrostatic event on I/O pad 380, one of transistor 410, 510 is turned on and the other remains off. In the event of a positive electrostatic event, this positive voltage applied to gate 440 of transistor 410 turns on transistor 410 and connects node 490 to ground. Transistor 510 is off. As a result, transistor 310 functions as a grounded gate NMOS transistor. If the positive voltage on I/O pad 380 is sufficiently great, the P-N junction (represented by diode 360) in the collector-base junction of the parasitic bipolar transistor in transistor 310 breaks down and conducts to discharge the positive electrostatic charge.

In the event of a negative electrostatic event on I/O pad 380, transistor 510 formed between the body and the drain region is turned on while the negative voltage applied to gate 440 of transistor 410 holds transistor 410 off. As a result, the voltage at node 490 becomes approximately the pad voltage. If the negative voltage on the I/O pad is sufficiently great, the P-N junction in the emitter base junction of the parasitic bipolar transistor in transistor 310 breaks down and conducts to discharge the negative electrostatic charge.

Figure 4:
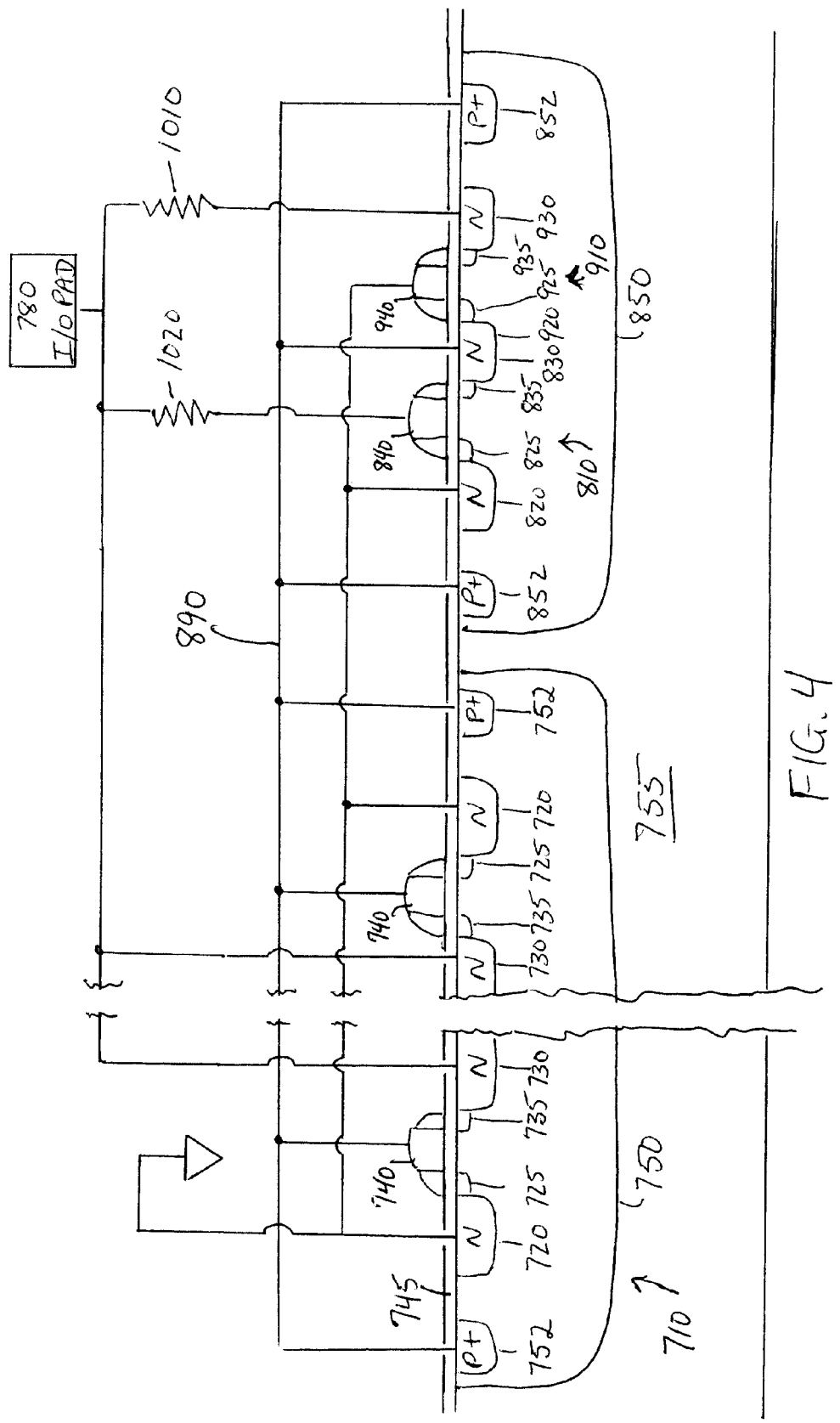
FIG. 4 is a cross-section of an illustrative implementation of the circuit of FIG. 3.

FIG. 4 depicts a cross-section of an illustrative embodiment of the circuit of FIG. 3. In FIG. 4, elements that correspond to the circuits elements of FIG. 3 bear the same number incremented by 400. First NMOS transistor 710 illustratively is formed as a multi-fingered gate device with N-type source regions 720, N-type drain regions 730 and gates 740. Illustratively, there may be 20 such gates, only two of which are shown. An insulating layer 745 separates the gates from the source and drain regions. The source and drain regions are formed in a well 750 of P-type conductivity which is formed in a substrate 755 also of P-type conductivity. A contact region 752 of P+ type conductivity surrounds transistor 710 and provides ohmic contact to the P-type well (or body). Transistor 710 further comprises lightly doped drain (LDD) regions 725, 735 of N-type conductivity extending in the well from each source and drain region toward the other region. Well 750 forms a first P-N junction with each source region 720 and a second P-N junction with each drain region 730.

Second and third NMOS transistors 810 and 910 are formed in P-type well 850 in the substrate 755 adjacent transistor 710. The second transistor comprises an N-type source region 820, an N-type drain region 830 and a gate 840; and the third transistor comprises an N-type source region 920, an N-type drain region 930 and a gate 940. A contact region 852 of P+ type conductivity surrounds transistors 810, 910. As shown in FIG. 4, drain region 830 and source region 920 are formed in the same N-type region. Transistor 810 further comprises N-type LDD regions 825, 835 extending toward each other from source and drain regions 820, 830; and transistor 910 comprises N-type LDD regions 925, 935 extending toward each other from source and drain regions 920, 930.

As shown in FIG. 4, source regions 720 of first transistor 710, source region 820 of second transistor 810 and gate 940 of third transistor 910 are all connected to ground. Gates 740, contact region 752, contact region 852 and drain region 830/source region 920 are connected together at node 890. Drain 930 is connected to one end of a first resistor 1010, the other end of which is connected to an I/O pad 780; and gate 840 of transistor 810 is connected to one end of a second resistor 1020, the other end of which is also connected to I/O pad 780. Advantageously, resistors 1010 and 1020 are integral parts of the integrated circuit formed, for example, in a polysilicon layer on the substrate.

The structure of FIG. 4 is advantageously formed as other transistor structures are formed in the integrated circuit. Insulating layer 745 is formed at the same time as other insulating layers and gates 740, 840 and 940 are formed at the same time as other gate structures. LDD regions 725, 735, 825, 835, 925, 935 are formed in the body at the same time as other LDD regions are formed. N-type regions 720, 730, 820, 830, 920, 930 are likewise formed at the same time as other N-type source and drain regions are formed. Likewise, contact regions 752 and 852 are formed at the same time as other P-type contact regions are formed.

As will be apparent to those skilled in the art, numerous variations may be made within the spirit and scope of the invention.

What is claimed is:

1. An input/output (I/O) circuit with electrostatic discharge (ESD) protection comprising:
    an I/O pad;
    a first transistor having a source, a drain, a gate, and a body, the drain being connected to the I/O pad, and the source being connected to ground; and
    second and third series-connected transistors, each having a source, a drain, a gate, and a body, the drain of the second transistor being connected to the source of the third transistor at a first node, the source of the second transistor being connected to ground and a drain of the third transistor being connected to the I/O pad, the gate of the second transistor being connected to the I/O pad and the gate of the third transistor being connected to ground and the body of the first transistor being connected to the first node.

2. The circuit of claim 1 wherein the bodies of the second and third transistors are connected to the first node.

3. The circuit of claim 1 further comprising a resistor connected between the drain of the third transistor and the I/O pad.

4. The circuit of claim 1 further comprising a resistor connected between the I/O pad and the gate of the second transistor.

5. The circuit of claim 1 wherein the gate of the first transistor is connected to the first node.

6. The circuit of claim 1 wherein the first transistor is an NMOS transistor.

7. The circuit of claim 1 wherein the second and third transistors are NMOS transistors.

8. An electrostatic discharge (ESD) protection circuit comprising:
    a first transistor having a source and drain of a first-type conductivity formed in a body of second-type conductivity and a gate formed on the body, the source and drain being connected between ground and an input/output (I/O) pad;
    second and third transistors connected in series between ground and said I/O pad, each transistor having a source, a drain, a gate, and a body, the second and third transistors being connected at a first node;
    the gate of the second transistor being connected to the I/O pad and the gate of the third transistor being connected to ground; and
    the body of the first transistor being connected to the first node.

9. The circuit of claim 8 further comprising a first resistor connected between the I/O pad and the third transistor.

10. The circuit of claim 8 further comprising a second resistor connected between the I/O pad and the gate of the second transistor.

11. The circuit of claim 8 wherein the gate of the first transistor is connected to the first node.

12. The circuit of claim 8 wherein the bodies of the second and third transistors are connected to the first node.

13. The circuit of claim 8 wherein the first transistor is an NMOS transistor.

14. The circuit of claim 8 wherein the second and third transistors are NMOS transistors.

15. In an input/output (I/O) circuit, a method of protecting against electrostatic discharge comprising the steps of:
    connecting a first transistor having a source, a drain, a gate and a body between an I/O pad and ground;
    connecting second and third series-connected transistors, each having a source, a drain, a gate and a body between the I/O pad and ground;
    connecting the body of the first transistor to a first node between the second and third transistors; and
    biasing the second and third transistors so that when the I/O pad experiences positive voltages the first node is at ground and when the I/O pad experiences negative voltages the first node is at a negative voltage.

16. The method of claim 15 wherein the drain of the first transistor is connected to the I/O pad and its source is connected to ground, the drain of the second transistor is connected to the first node and its source is connected to ground, and the drain of the third transistor is connected to the I/O pad and its source is connected to the first node.

17. The method of claim 15 further comprising the step of connecting the gate of the first transistor to the first node.

18. The method of claim 15 wherein the step of biasing the second and third transistors comprises the step of connecting the gate of the second transistor to the I/O pad and the gate of the third transistor to ground.

19. The method of claim 15 further comprising the step of connecting the bodies of the second and third transistors to the first node.

20. The method of claim 15 wherein the first transistor is an NMOS transistor.

* * * * *